US010672967B2

(12) United States Patent
Denis et al.

(10) Patent No.: US 10,672,967 B2
(45) Date of Patent: Jun. 2, 2020

(54) SYSTEMS FOR ENERGY HARVESTING USING WELDING SUBSYSTEMS

(71) Applicant: ILLINOIS TOOL WORKS INC., Glenview, IL (US)

(72) Inventors: Marc Lee Denis, Lena, WI (US); Kevin John Mlnarik, De Pere, WI (US)

(73) Assignee: Illinois Tool Works Inc., Glenview, IL (US)

(*) Notice: Subject to any disclaimer, the term of this patent is extended or adjusted under 35 U.S.C. 154(b) by 0 days.

(21) Appl. No.: 14/576,503

(22) Filed: Dec. 19, 2014

(65) Prior Publication Data

US 2016/0181499 A1 Jun. 23, 2016

(51) Int. Cl.
| | |
|---|---|
| *H01L 35/30* | (2006.01) |
| *B23K 9/167* | (2006.01) |
| *B23K 9/16* | (2006.01) |
| *B23K 9/32* | (2006.01) |
| *B23K 9/10* | (2006.01) |
| *H02J 50/00* | (2016.01) |
| *B23K 9/173* | (2006.01) |
| *B23K 31/00* | (2006.01) |
| *H01L 41/08* | (2006.01) |

(52) U.S. Cl.
CPC ............ *H01L 35/30* (2013.01); *B23K 9/1006* (2013.01); *B23K 9/16* (2013.01); *B23K 9/167* (2013.01); *B23K 9/173* (2013.01); *B23K 9/32* (2013.01); *B23K 31/00* (2013.01); *H01L 41/08* (2013.01); *H02J 50/00* (2016.02)

(58) Field of Classification Search
CPC ........ B23K 9/10; B23K 31/00; B23K 9/1006; B23K 9/16; B23K 9/167; B23K 9/173; B23K 9/32; H01L 35/30; H01L 41/08; H02J 50/00
USPC ........................... 219/201; 136/205; 310/311
See application file for complete search history.

(56) References Cited

U.S. PATENT DOCUMENTS

| | | | |
|---|---|---|---|
| 4,166,197 A * | 8/1979 | Moog | .................... H03G 5/025 381/101 |
| 4,521,672 A | 6/1985 | Fronius | |
| 6,311,279 B1 | 10/2001 | Nguyen | |

(Continued)

FOREIGN PATENT DOCUMENTS

| | | |
|---|---|---|
| CN | 102712225 | 10/2012 |
| CN | 103182614 | 7/2013 |

(Continued)

OTHER PUBLICATIONS

International Search Report from PCT application no. PCT/US2015/059643, dated Feb. 24, 2016, 13 pgs.

(Continued)

*Primary Examiner* — Lorne E Meade
*Assistant Examiner* — Joe E Mills, Jr.
(74) *Attorney, Agent, or Firm* — McAndrews, Held & Malloy, Ltd.

(57) ABSTRACT

An energy harvesting system including an energy harvesting device configured to draw electrical energy from a welding process without direct electrical contact with a weld cable. The energy harvesting system also includes energy harvesting circuitry coupled to the energy harvesting device and configured to process the electrical energy for use by a welding-related device.

11 Claims, 5 Drawing Sheets

(56) References Cited

U.S. PATENT DOCUMENTS

| | | | | |
|---|---|---|---|---|
| 6,463,010 B1* | 10/2002 | Nakamiya | ............... | G04C 10/00 368/204 |
| 8,405,001 B2 | 3/2013 | Albrecht | | |
| 8,482,157 B2 | 7/2013 | Cook | | |
| 8,594,956 B2* | 11/2013 | Banting | ............... | G01R 15/142 324/127 |
| 8,680,434 B2 | 3/2014 | Stoger | ................. | B23K 9/0956 219/136 |
| 2004/0206737 A1* | 10/2004 | Holverson | ........... | B23K 9/0953 219/130.5 |
| 2007/0178857 A1 | 8/2007 | Greene | | |
| 2008/0116185 A1* | 5/2008 | Luck | .................... | B23K 9/1087 219/132 |
| 2008/0174120 A1 | 7/2008 | Gardner | | |
| 2008/0290855 A1 | 11/2008 | Fishman | | |
| 2009/0231423 A1* | 9/2009 | Becker | ...................... | A61F 9/06 348/82 |
| 2010/0084920 A1* | 4/2010 | Banting | ............... | G01R 15/142 307/66 |
| 2010/0314097 A1* | 12/2010 | Jennings | ................ | G01B 17/00 166/65.1 |
| 2011/0071774 A1* | 3/2011 | Fonda | ................... | F15B 19/005 702/50 |
| 2011/0240620 A1* | 10/2011 | Ott | ......................... | B23K 9/124 219/130.5 |
| 2012/0007469 A1* | 1/2012 | Matova | .............. | H01L 41/1136 310/322 |
| 2012/0067859 A1* | 3/2012 | Albrecht | ................ | B23K 9/125 219/137 R |
| 2012/0169064 A1 | 7/2012 | Hoffman | | |
| 2012/0250465 A1* | 10/2012 | Seuthe | ................... | G01N 29/28 367/140 |
| 2012/0293021 A1 | 11/2012 | Teggatz | | |
| 2013/0187471 A1 | 7/2013 | Kim | | |
| 2013/0221680 A1* | 8/2013 | Mian | ................... | H02K 57/003 290/1 R |
| 2013/0221761 A1* | 8/2013 | DePaso | ................. | B65G 17/08 307/151 |
| 2013/0264322 A1* | 10/2013 | Bornemann | ............ | B23K 9/32 219/136 |
| 2013/0291271 A1* | 11/2013 | Becker | ................... | G06F 3/005 2/8.2 |
| 2013/0327370 A1* | 12/2013 | Ward | ...................... | H01L 35/32 136/230 |
| 2014/0096808 A1* | 4/2014 | Moczygemba | ......... | H01L 35/30 136/205 |
| 2014/0251965 A1* | 9/2014 | Wiryadinata | ........ | B23K 9/0953 219/130.1 |
| 2014/0253032 A1 | 9/2014 | Bruwer | | |
| 2014/0352801 A1* | 12/2014 | McAlister | ............ | B60K 15/035 137/312 |
| 2014/0366552 A1 | 12/2014 | Szwedowicz | | |
| 2014/0367018 A1* | 12/2014 | Klinstein | ............ | B29C 66/9511 156/64 |
| 2014/0368293 A1 | 12/2014 | Mukaiyama | | |
| 2014/0379160 A1 | 12/2014 | Fallon | | |
| 2015/0059469 A1* | 3/2015 | Batti | ....................... | G01F 23/22 73/295 |
| 2015/0069037 A1* | 3/2015 | Farah | ................... | B23K 9/1081 219/134 |
| 2015/0074431 A1 | 3/2015 | Nguyen | | |
| 2015/0214746 A1 | 7/2015 | Lopez Gomez | | |
| 2016/0049794 A1 | 2/2016 | Liu | | |
| 2016/0172870 A1 | 6/2016 | Blum | | |
| 2016/0190917 A1 | 6/2016 | Delos Ayllon | | |
| 2016/0322914 A1 | 11/2016 | Rodriguez Rios | | |

FOREIGN PATENT DOCUMENTS

| | | | | |
|---|---|---|---|---|
| CN | 203364899 | | 12/2013 | |
| EP | 1138429 | | 10/2001 | |
| EP | 1113348 | | 7/2006 | |
| EP | 2597749 | | 5/2013 | |
| JP | H0614479 | | 1/1994 | |
| JP | 2010283913 | | 12/2010 | |
| JP | 2011000639 | | 1/2011 | |
| WO | 03005380 | | 1/2003 | |
| WO | WO 2010141431 A1 * | 12/2010 | ............ | H02M 3/157 |
| WO | 2012015942 | | 2/2012 | |
| WO | WO 2013088419 A1 * | 6/2013 | ............. | H01H 9/168 |

OTHER PUBLICATIONS

International Search Report from PCT application no. PCT/US2015/059644, dated Jan. 28, 2016, 12 pgs.

* cited by examiner

SYSTEMS FOR ENERGY HARVESTING USING WELDING SUBSYSTEMS

BACKGROUND

The disclosure relates generally to the field of welding systems and, more particularly, to systems for energy harvesting from welding subsystems.

In typical welding systems, subsystems and accessories are powered by additional welding cables or batteries. However, larger capacity batteries may increase the size of the accessories, reducing the locations the accessories may be placed in the welding system. Moreover, for some operations, powering subsystems and accessories with batteries may be undesirable. Furthermore, coupling accessories with additional welding cables may be cumbersome or add clutter around the welding system. Accordingly, it is desirable to power welding subsystems and accessories without providing physical connections via welding cables or increasing the capacity of on-board batteries.

BRIEF DESCRIPTION

In one embodiment, an energy harvesting system includes an energy harvesting device configured to draw electrical energy from a welding process without direct electrical contact with a weld cable. The energy harvesting system also includes energy harvesting circuitry coupled to the energy harvesting device and configured to process the electrical energy for use by a welding-related device.

In another embodiment, a welding system includes an energy harvesting system configured to draw electrical energy from a welding process without direct electrical contact with a source of the electrical energy. The welding system also includes a welding-related device configured to receive and use the electrical energy.

In a further embodiment, a welding system includes a welding power supply unit configured to supply electrical energy for use in a welding operation and a welding-related device configured to perform at least part of the welding operation. The welding power supply unit monitors and controls the welding-related device. The welding system also includes an energy harvesting system configured to draw electrical energy from the welding operation without direct electrical contact with a source of the electrical energy, and to at least partially power the welding-related device.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The embodiments described herein include systems for harvesting electrical energy from welding operations to power associated welding subsystems and accessories. In certain embodiments, an energy harvesting system may be incorporated into a welding accessory (e.g., a torch, a sensor, a helmet, etc.) to provide operational power and/or charge an on-board battery. For example, the energy harvesting system may include an energy harvesting device, such as a Seebeck device, that generates energy due to a thermal gradient. In other embodiments, the energy harvesting device may include a piezoelectric device that generates an electric charge due to mechanical stress or kinetic energy. For example, the piezoelectric device may be mounted to a grinder or placed in an air supply line to generate the electric charge during welding operations. The energy harvesting system may include circuitry to communicate with associated components of the welding system and/or to condition the harvested electric energy. For example, the energy harvesting system may include wireless communication circuitry to send and/or receive signals from the welding power supply. Accordingly, welding accessories may be powered by on-board energy harvesting systems or via electrical communication with energy harvesting systems, thereby reducing the weight and complexity of the welding system.

Figure 1:
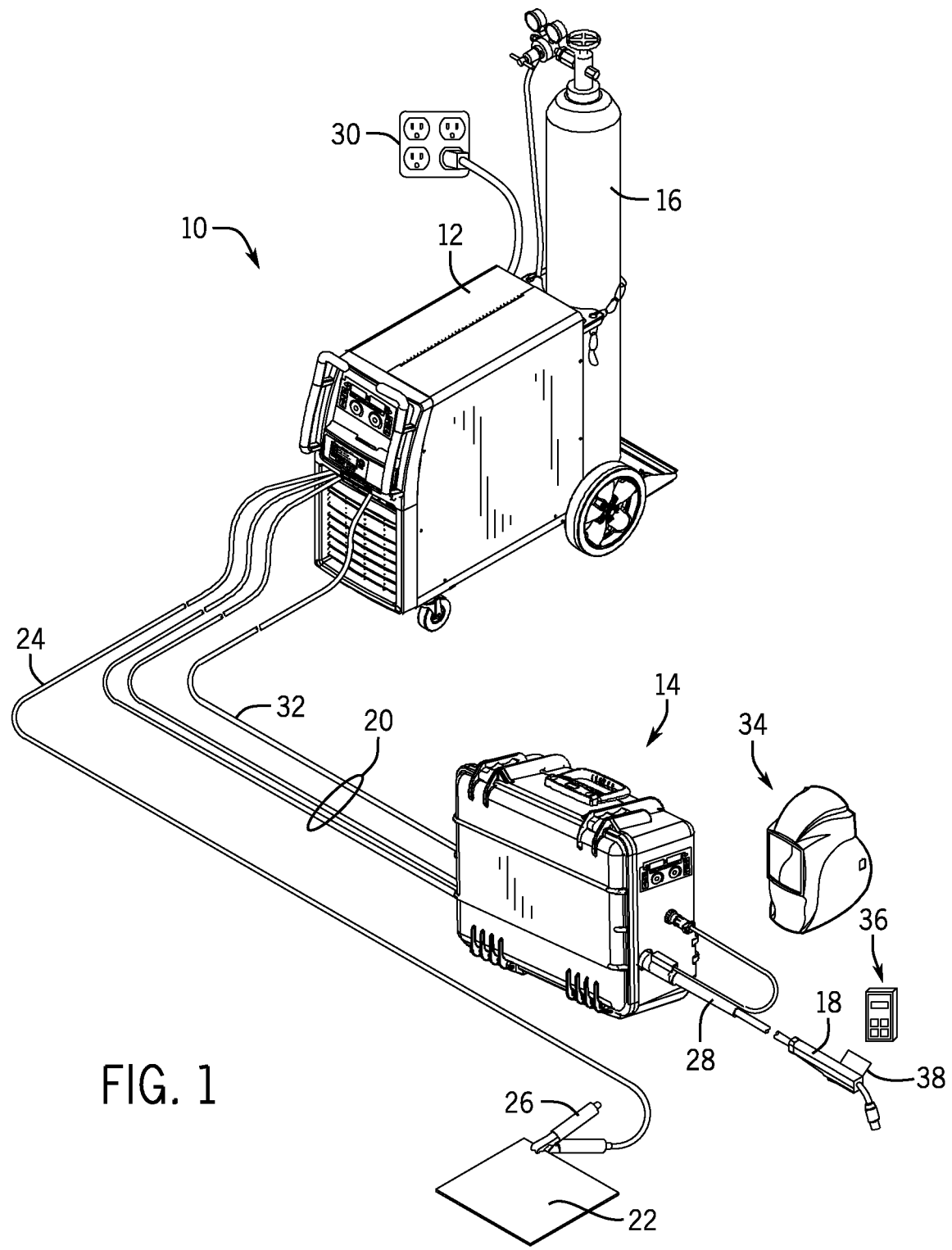
FIG. 1 is a perspective view of an embodiment of a welding system that may utilize energy harvesting devices, in accordance with embodiments of the present disclosure.

Turning to the figures, FIG. 1 is a diagram of an embodiment of a welding system 10 that may include an energy harvesting system, in accordance with embodiments of the present disclosure. It should be appreciated that, while the welding system 10 described herein is specifically presented as a gas metal arc welding (GMAW) system 10, the presently disclosed energy harvesting system may also be used with other arc welding processes (e.g., FCAW, FCAW-G, GTAW, SAW, SMAW, or similar arc welding processes) or other metal fabrication systems, such as plasma cutting systems, induction heating systems, and so forth. As described in greater detail below, all equipment and accessories used in the welding system 10 may include the energy harvesting systems. The welding system 10 includes a welding power supply unit 12 (i.e., a welding power source), a welding wire feeder 14, a gas supply system 16, and a welding torch 18. The welding power supply unit 12 generally supplies power for the welding system 10 and other various accessories, and may be coupled to the welding wire feeder 14 via a weld cable 20 as well as coupled to a workpiece 22 using a lead cable 24 having a clamp 26. In the illustrated embodiment, the welding wire feeder 14 is coupled to the welding torch 18 via a weld cable 28 in order to supply welding wire and power to the welding torch 18 during operation of the welding system 10. In another embodiment, the welding power supply unit 12 may couple and directly supply power to the welding torch 18.

In the embodiment illustrated in FIG. 1, the welding power supply unit 12 may generally include energy conversion circuitry that receives input energy from an alternating current power source 30 (e.g., the AC power grid, an engine/generator set, or a combination thereof), conditions the input power, and provides DC or AC output power via the weld cable 20. As such, the welding power supply unit 12 may power the welding wire feeder 14 that, in turn, powers the welding torch 18, in accordance with demands of the welding system 10. The lead cable 24 terminating in the clamp 26 couples the welding power supply unit 12 to the workpiece 22 to close the circuit between the welding power supply unit 12, the workpiece 22, and the welding torch 18. The welding power supply unit 12 may include circuit elements (e.g., transformers, rectifiers, switches, and so forth) capable of converting the AC input power to a direct current electrode positive (DCEP) output, direct current electrode negative (DCEN) output, DC variable polarity, or a variable balance (e.g., balanced or unbalanced) AC output, as dictated by the demands of the welding system 10 (e.g., based on the type of welding process performed by the welding system 10, and so forth).

The illustrated welding system 10 includes a gas supply system 16 that supplies a shielding gas or shielding gas mixtures to the welding torch 18. In the depicted embodiment, the gas supply system 16 is directly coupled to the welding torch 18 via a gas conduit 32 that is part of the weld cable 20 from the welding power supply unit 12. In another embodiment, the gas supply system 16 may instead be coupled to the welding wire feeder 14, and the welding wire feeder 14 may regulate the flow of gas from the gas supply system 16 to the welding torch 18. A shielding gas, as used herein, may refer to any gas or mixture of gases that may be provided to the arc and/or weld pool in order to provide a particular local atmosphere (e.g., shield the arc, improve arc stability, limit the formation of metal oxides, improve wetting of the metal surfaces, alter the chemistry of the weld deposit, and so forth). In certain embodiments, the gas supply system 16 may be configured to supply pressurized air to pneumatic tools (e.g., impact wrenches, chipping hammers, etc.).

In addition, in certain embodiments, other welding equipment and welding accessories (e.g., welding-related devices) may be used in the welding system 10. For example, in most welding applications, a welding helmet 34 may be worn by an operator of the welding system 10. The welding helmet 34 provides protection to the operator of the welding system 10, particularly protecting the eyes of the operator from the flashing associated with the welding arc during welding operations. In addition, in certain embodiments, the welding helmet 34 may provide feedback to the operator related to parameters of the welding operations. For example, the welding helmet 34 may include an internal display configured to display the welding parameters to the operator during the welding operations. In addition, in certain embodiments, a welding accessory 36 (also referred to as a welding subsystem) may be used to communicate between the welding wire feeder 14 and the welding torch 18. For example, the welding accessory 36 may be a remote control (e.g., a wireless remote control, a wired remote control, and so forth), a sensor, a battery, a weld conditioning tool, or the like. In certain embodiments, the welding accessory 36 may communicate with the system 10. For example, the welding accessory 36 may include wireless communication circuitry to send and receive signals from the weld system 10. Additionally, the welding accessory 36 may be used at a welding application remote from an associated welding power supply unit 12 and/or welding wire feeder 14. For example, in certain embodiments, the welding accessory 36 may be a sensor disposed proximate to a weld to detect the temperature of the workpiece 22 during the welding operation. In other words, the welding accessory 36 may receive data and relay the data back to the welding power supply unit 12 and/or the welding wire feeder 14 (e.g., via a wireless network connection, Ethernet radio link, etc.).

In the illustrated embodiment, an energy harvesting system 38 is coupled to the welding torch 18. As will be described in detail below, the energy harvesting system 38 is configured to harvest energy from an associated welding operation to power a device associated with (e.g., operatively coupled to, for example, communicatively and/or electrically coupled) the welding power supply unit 12 and/or the welding wire feeder 14, for example, the welding torch 18, the welding helmet 34, the welding accessory 36, or any other welding-related devices, such as grinders, hammers, auxiliary lighting, and so forth. In other words, as used herein, the term "welding-related device" relates to any and all devices described herein that are operatively coupled to, but separate from, the welding power supply unit 12 and/or the welding wire feeder 14. Moreover, the term "welding-related devices" may include other devices that are not described herein, that may be operatively, communicatively, electrically, or otherwise coupled to the welding power supply unit 12 and/or the welding wire feeder 14, and that may either function as sources of electrical energy for the energy harvesting system 38 or may utilize the electrical energy harvested by the energy harvesting system 38. While the illustrated embodiment depicts the energy harvesting system 38 disposed on the welding torch 18, in other embodiments, the energy harvesting system 38 may be placed at various locations within the welding system 10. For example, the energy harvesting system 38 may be placed on the wire feeder 14, the weld cable 20, the workpiece 22, the welding accessory 36, or any other suitable location within the welding system 10.

The welding equipment and accessories illustrated in FIG. 1 are merely exemplary and not intended to be limiting of the types of welding equipment and accessories that may be used in the welding system 10 and include energy harvesting devices. As will be appreciated, welding systems 10 may sometimes become somewhat complex with the number of welding equipment and accessories that are included in the welding systems 10.

Figure 2:
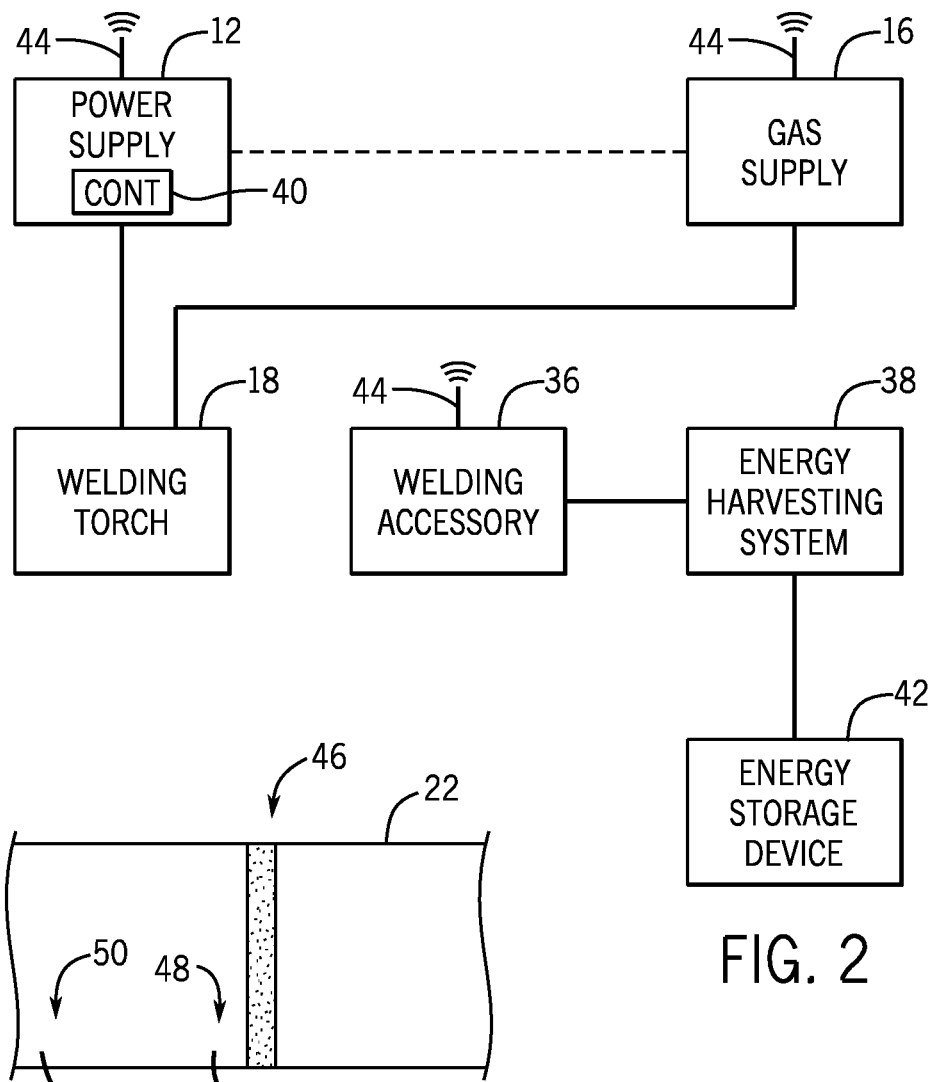
FIG. 2 is a block diagram of an embodiment of the welding system of FIG. 1 including an energy harvesting system, in accordance with embodiments of the present disclosure.

FIG. 2 is a block diagram of an embodiment of the welding system 10 having the energy harvesting system 38 coupled to the welding accessory 36. As described above, the welding power supply unit 12 is coupled to the welding torch 18 and configured to provide the electrical energy for the welding operation. A controller 40 is incorporated within the welding power supply unit 12. In certain embodiments, the controller 40 is configured to manage welding operations based on feedback from one or more welding accessories 36, among other components of the welding system 10. For example, the controller 40 may receive a signal from a sensor disposed on the welding torch 18 indicative of a voltage level. As a result, the controller 40 may adjust the voltage output of the welding power supply unit 12 based on the received signal.

As illustrated in FIG. 2, the gas supply system 16 is coupled to the welding torch 18 and configured to supply a shielding gas to the welding torch 18. Moreover, the controller 40 of the welding power supply unit 12 may control and adjust operations of the gas supply system 16. For example, the controller 40 of the welding power supply unit 12 may increase the flow rate of shielding gas to the welding torch 18 based on an input from the operator. Furthermore, while the illustrated embodiment depicts the gas supply system 16 coupled to the welding torch 18, in other embodiments the gas supply system 16 may supply the gas flow to other welding accessories and subsystems. For example, the gas supply system 16 may supply pressurized air to a pneumatic hammer, grinder, or the like.

As mentioned above, in certain embodiments, the welding accessory 36 may be a sensor configured to relay information (e.g., relating to a voltage, a temperature, a gas flow rate, etc.) to the welding power supply unit 12 to manage welding operations. In the illustrated embodiment, the welding accessory 36 is a sensor positioned proximate to the welding torch 18. However, in other embodiments, the welding accessory 36 may be coupled to the welding torch 18, or some other component of the welding system 10. Additionally, in the illustrated embodiment, the energy harvesting system 38 is coupled to the welding accessory 36. As mentioned above, the energy harvesting system 38 is configured to harvest energy from a welding process performed by the welding system 10, without direct electrical contact with (i.e., not being directly electrically connected to) the weld cable 20 or any other source of the energy, and to provide electrical power to the welding accessory 36 and/or other welding subsystem (e.g., other welding-related accessories operatively coupled to the welding power supply unit 12 and/or wire feeder 14) using the harvested energy.

Moreover, as shown in FIG. 2, the energy harvesting system 38 may provide energy to an energy storage device 42. In certain embodiments, the energy storage device 42 may be a rechargeable battery (e.g., a lithium-ion battery, a lithium-magnesium battery, a lead acid battery), a low leakage capacitor, a super capacitor, a fuel cell, a solid state energy storage device (e.g., a silicon-based capacitor), or any chemically based energy storage device. In certain embodiments, the energy storage device 42 may be integrated into the welding accessory 36. For example, the energy storage device 42 may be an on-board rechargeable battery. However, in other embodiments, the energy storage device 42 may be a stand-alone unit (e.g., a back-up battery) configured to provide energy to the welding accessory 36 or other welding subsystem. Moreover, in certain embodiments, the energy storage device 42 may be integrated into the energy harvesting system 38. For example, the energy harvesting system 38 may include a rechargeable battery that may be removed to power the welding accessories 36.

In certain embodiments, components of the welding system 10 may include wireless transceivers 44 to send and/or receive signals from other components of the welding system 10. As used herein, a wireless transceiver refers to a device capable of sending and/or receiving wireless signals. For example, the wireless transceivers 44 may include IEEE 802.11x-based WI-FI wireless transceivers, IEEE 802.15.1 BLUETOOTH wireless transceivers, IEEE 802.15.4 ZIG-BEE™ wireless transceivers, cellular transceivers (e.g., 4G or LTE cellular networks), or the like. For example, the wireless transceiver 44 may be coupled to the welding power supply unit 12 or to the welding accessory 36. As such, the wireless transceiver 44 may be configured to send and receive signals between the welding power supply unit 12 and the welding accessory 36. However, in other embodiments, the system may include hard-wired communications or any other suitable communication devices. In the illustrated embodiment, the welding power supply unit 12, the gas supply system 16, and the welding accessory 36 include wireless transceivers 44 configured to enable communication between the devices. For example, the welding power supply unit 12 may receive a signal from the welding accessory 36 indicative of an undesirable voltage level at a weld site. While the illustrated embodiment depicts wireless transceivers 44, in certain embodiments, wired connections may communicatively couple the components (e.g., the welding power supply unit 12, etc.) of the welding system 10.

Figure 3:
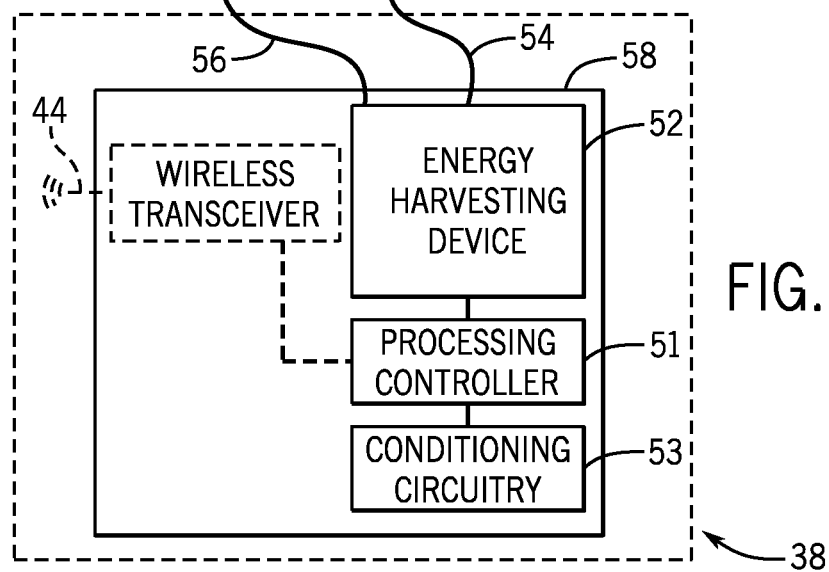
FIG. 3 is a schematic diagram of an embodiment of an energy harvesting system positioned proximate to a welding operation.

FIG. 3 is a schematic diagram of an embodiment of the energy harvesting system 38 disposed proximate to a welding operation. In the illustrated embodiment, the energy harvesting system 38 is a stand-alone unit disposed proximate to a weld 46. The welding torch 18 is configured to form the weld 46 on the workpiece(s) 22 by heating the workpiece(s) 22. However, the heat generated by the welding operation is typically confined to a small area of the weld 46 (e.g., the heat affected zone) and some surrounding material. Accordingly, a temperature gradient is formed between a first area 48 proximate to the weld 46 and a second area 50 farther from the weld 46.

In the illustrated embodiment, the energy harvesting system 38 includes an energy harvesting device 52 configured to draw (i.e., harvest, scavenge, etc.) electrical energy from the temperature gradient between the first area 48 and the second area 50. However, as will be described below, other energy harvesting devices may be used. As mentioned above, the temperature of the first area 48 is higher than the temperature of the second area 50 due to the welding operation utilized to form the weld 46. As a result, the energy harvesting device 52 may utilize a thermoelectric effect (e.g., Seebeck effect) to generate electrical energy. For example, two dissimilar conductors (e.g., metals, semiconductors, etc.) may be placed proximate to the first area 48 and the second area 50. The temperature difference between the conductors produces a voltage between the conductors, enabling energy capture from the temperature gradient. For example, the illustrated energy harvesting device 52 includes a first thermocouple 54 positioned near the first area 48 and a second thermocouple 56 positioned near the second area 50. As used herein, thermocouple may refer to a temperature measuring device or a lead (e.g., a conductor, a semi-conductor) configured to transmit thermal energy from one location to another. Additionally, in certain embodiments, the first and second thermocouples 54, 56 may include magnets to facilitate coupling to the workpiece 22. As mentioned above, the first and second thermocouples 54, 56 may be dissimilar conductive materials.

The first and second thermocouples 54, 56 may be coupled to a housing 58 of the energy harvesting system 38 having a processing controller 51 and conditioning circuitry 53 to capture and convert the voltage generated between the first and second thermocouples 54, 56 for additional processing and/or distribution to an energy consumer-consuming and/or energy storage device (e.g., the welding accessory 36, the energy storage device 42, etc.). For example, the processing controller 51 may include processing circuitry configured to direct distribution of the energy received from the energy harvesting device 52. For example, the processing controller 51 may distribute operational energy directly to the welding-related device (e.g., the welding accessory 36). Furthermore, the processing controller 51 may include a processor and a memory. The memory may be any type of non-transitory machine readable medium for storing data and executable instructions, such as random-access memory, read-only memory, rewritable flash memory, hard drives, optical discs, and the like. The processor may execute instructions stored on the memory. For example, the memory may contain machine readable code, such as instructions that may be executed by the processor. In some embodiments, the memory and processor may enable automatic (e.g., processor/memory controlled) operation of the welding system 10. Additionally, in certain embodiments, the processing controller 51 may direct the energy to the energy storage device 42 for storage and later use.

Additionally, the energy harvesting system 38 may include conditioning circuitry 53 to filter and prepare the energy received by the energy harvesting device 52 for consumption. In certain embodiments, the conditioning circuitry 53 includes transformers, rectifiers, switches, resistors, and the like for conditioning the energy distributed from the energy harvesting device 52. For example, in certain embodiments, the energy harvesting system 38 may include a voltage regulator disposed within the housing 58 to reduce the voltage to a desired level. Additionally, while the processing controller 51 is positioned upstream of the conditioning circuitry 53 in the illustrated embodiment, in other embodiments the conditioning circuitry 53 may be upstream of the processing controller 51. Moreover, a wireless transceiver 44 may be incorporated into the housing 58 of the energy harvesting system 38 to communicate with the welding power supply unit 12, the wire feeder 14, or other components of the welding system 10. For example, the wireless transceiver 44 may include wireless circuitry configured to enable communication between the wireless transceiver 44 and other wireless or wired communication devices. Additionally, in other embodiments, the wireless transceiver 44 may not be integrated within the housing 58 of the energy harvesting system 58. For example, the wireless transceiver 44 may be incorporated with the welding accessory 36 and the energy harvesting system 38 may be a separate module configured to supply operational power to the welding accessory 36 and/or the wireless transceiver 44.

While the illustrated embodiment includes the first thermocouple 54 coupled to the first area 48 and the second thermocouple 56 coupled to the second area 50, in other embodiments the second thermocouple 56 may not be coupled to the workpiece 22. As mentioned above, the Seebeck device operates via a temperature gradient between the conductors. As a result, the second thermocouple 56 may extend into the ambient air to provide a sufficient temperature gradient between the second thermocouple 56 and the first thermocouple 54. Furthermore, in certain embodiments, the second thermocouple 56 includes a heat sink to provide the temperature gradient between the second thermocouple 56 and the first thermocouple 54.

Figure 4:
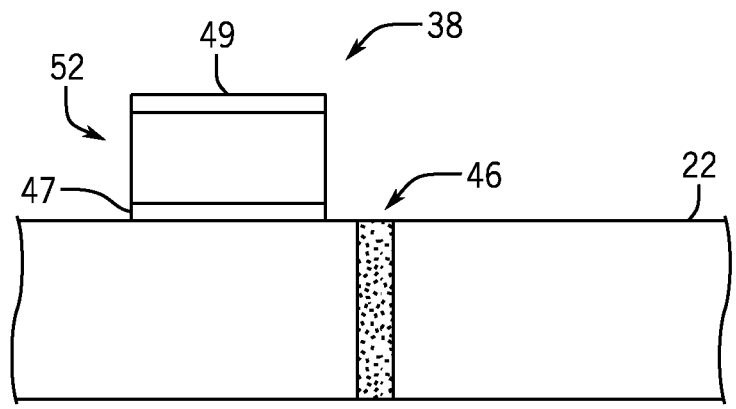
FIG. 4 is a schematic diagram of an embodiment of an energy harvesting system positioned proximate to a welding operation.

FIG. 4 is a schematic diagram of an embodiment of the energy harvesting system 32 disposed on the workpiece 22. In the illustrated embodiment, the energy harvesting device 52 is a Seebeck device. As described above, the Seebeck device converts a temperature gradient into electrical energy. In the illustrated embodiment, the energy harvesting device 52 is mounted proximate to the weld 46. As will be appreciated, the weld 46 dissipates heat proximate to the weld 46. Accordingly, a first side 47 is mounted on the workpiece 22 while a second side 49 is exposed to ambient air. The temperature gradient between the workpiece 22 and the ambient air is utilized to generate electrical energy that may be used by the energy harvesting system 38. For example, the energy harvesting system 38 may transfer the electrical energy to the welding-related device (e.g., the welding accessory 36, the welding torch 18, etc.). Additionally, in some embodiments, the energy harvesting system 38 may transfer the electrical energy to the energy storage device 42 for storage and later use (e.g., the energy storage device 42 may direct the stored energy to the welding accessory 36). Accordingly, the Seebeck device may be utilized to generate electrical energy without the leads between the Seebeck device and workpiece 22. It will be appreciated that, in certain embodiments, the two sides 47, 49 of the Seebeck device may be disposed proximate to two separate locations (i.e., areas 48, 50 illustrated in FIG. 3) of the workpiece 22, thereby enabling the temperature gradient to be generated between the two separate locations on the workpiece 22.

Figure 5:
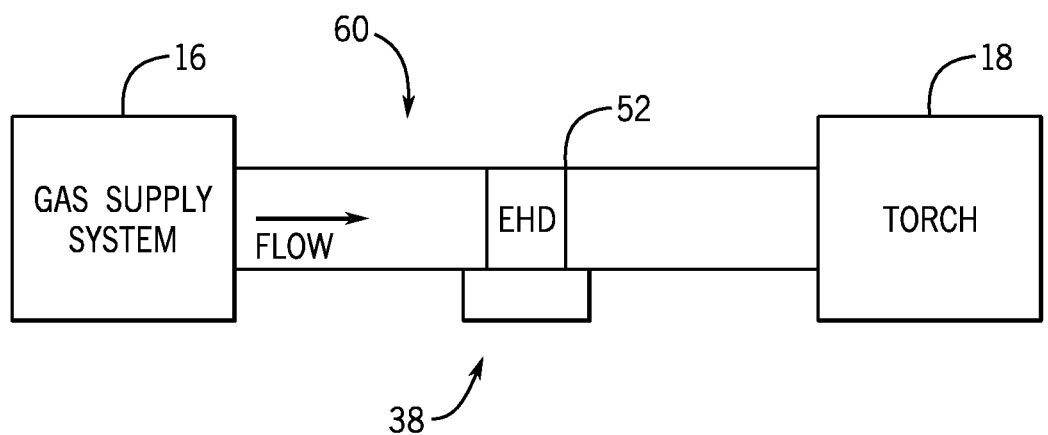
FIG. 5 is a schematic diagram of an embodiment of an energy harvesting system positioned between supply gas supply system and a welding torch.

FIG. 5 is a schematic diagram of an embodiment of the energy harvesting device 52 disposed between the welding torch 18 and the gas supply system 16. In the illustrated embodiment, the energy harvesting device 52 is a piezoelectric device disposed within a gas flow line 60. As the gas (e.g., shielding gas, air, etc.) flows through the gas flow line 60 toward the welding torch 18, the piezoelectric material absorbs and/or flexes due to the force of the gas flow. As a result, the piezoelectric effect exhibited by the piezoelectric material converts the applied mechanical energy (e.g., the gas flow) into electrical energy. As mentioned above, the energy harvesting system 38 may include circuitry (e.g., transformers, rectifiers, switches, and so forth) to convert the electrical energy from the energy harvesting device 52 into a voltage that is stored in the energy storage device 42. In other embodiments, the electrical energy may be distributed directly to the welding accessory 36 or other welding-related device for operational power. For example, the energy harvesting device 52 may be integrated with the welding accessory 36 or other welding-related device and directly distribute the electrical energy to the welding accessory 36 or other welding-related device. Moreover, in other embodiments, the piezoelectric material may be disposed in other locations. For example, the piezoelectric material may be in a flow line connected to an air filtration system of the welding helmet 34. Additionally, in other embodiments, the piezoelectric material may be in a flow line supplying instrument air to a hammer, grinder, or the like.

Figure 6:
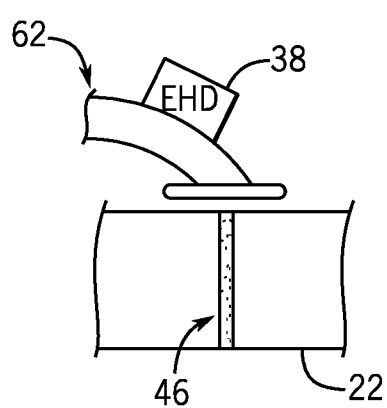
FIGS. 6-11 are schematic diagrams of embodiments of an energy harvesting system positioned on various welding accessories.

FIG. 6 is a schematic diagram of an embodiment of the energy harvesting system 38 disposed on a grinder 62. The grinder 62 may, for example, be used to reduce the size of a weld cap formed during the welding processes. Moreover, the grinder 62 may be used to prepare a surface for welding operations. As mentioned above, in certain embodiments, the energy harvesting device 52 of the energy harvesting system 38 may be a piezoelectric device configured to flex due to the vibration of the grinder 60 against the workpiece 22. Accordingly, the vibrational energy may be absorbed by the energy harvesting device 52 and converted to electric energy. For example, the electric energy may be converted to a DC voltage by the conditioning circuitry 53 of the energy harvesting system 38 and distributed to welding accessories 36 and/or other subsystems for use in other welding processes. In certain embodiments, the energy harvesting device 52 may be disposed on the workpiece 22 to generate energy from the conversion of the kinetic energy applied to the workpiece 22 through the use of a piezoelectric transducer.

Figure 7:
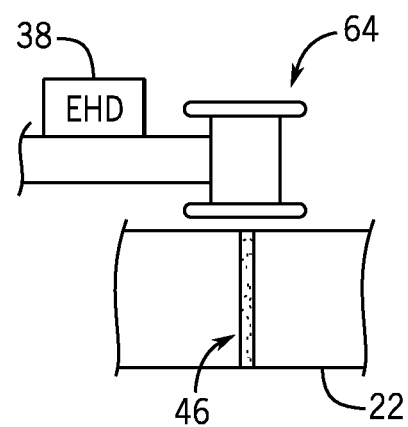

FIG. 7 is a schematic diagram of an embodiment of the energy harvesting device 52 disposed on a hammer 64. The hammer 64 may be used to relieve stresses in the weld 46 by peening the weld 46. By striking the weld 46 with the hammer 64, vibrational energy will travel up the handle of the hammer 64 to the energy harvesting device 52 of the energy harvesting system 38. In the illustrated embodiment, the energy harvesting device 52 is a piezoelectric device configured to absorb the vibrational energy and convert the vibrational energy to electrical energy. As described above, the energy harvesting system 38 may include the processing controller 51 and the conditioning circuitry 53 to store the electrical energy from the energy harvesting device 52 and to regulate a voltage output that may be used to provide operational energy to the welding accessories 36 and/or other subsystems for use in other welding processes. For example, the energy harvesting device 52 may charge a removable battery that may be installed in the welding accessories 36.

Figure 8:
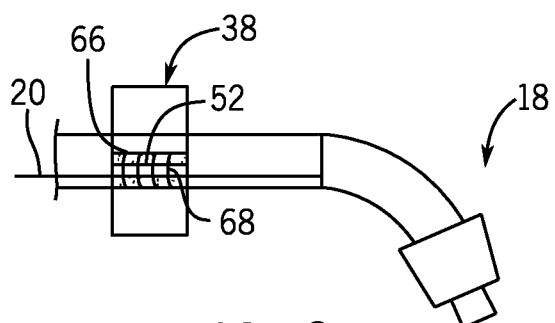

FIG. 8 is a schematic diagram of an embodiment of the energy harvesting system 38 disposed on the weld cable 20 coupling the welding torch 18 to the welding power supply unit 12. In the illustrated embodiment, the energy harvesting device 52 of the energy harvesting system 38 is configured to harvest a stray electromagnetic field generated by the conductive weld cable 20. For example, the energy harvesting device 52 may be a magnet 66 wrapped with conductive wire 68 and coupled to the weld cable 20. As the current flows through the weld cable 20, a magnetic field is generated around the weld cable 20. The magnetic field induces a voltage in the conductive wire 68 wrapped around the magnet 66, thereby enabling energy to be harvested from the current flowing through the weld cable 20. Other embodiments for harvesting electrical energy from the weld cable 20 are disclosed in U.S. patent application Ser. No. 14/576,684, entitled "METHODS AND SYSTEMS FOR HARVESTING WELD CABLE ENERGY TO POWER WELDING SUBSYSTEMS", in the name of Marc Lee Denis, filed Dec. 19, 2014, which is hereby incorporated herein by reference in its entirety for all purposes.

In other embodiments, the energy harvesting device 52 may harvest energy from other electromagnetic fields. For example, florescent lights positioned near a work area may emit an electromagnetic field, thereby enabling the energy harvesting device 52 to draw electrical energy from the florescent lights. As mentioned above, the energy harvesting system 38 may include the processing controller 51 and the conditioning circuitry 53 to covert and/or store (e.g., via transmission of the energy to the energy storage device 42) the voltage harvested by the energy harvesting device 52.

Figure 9:
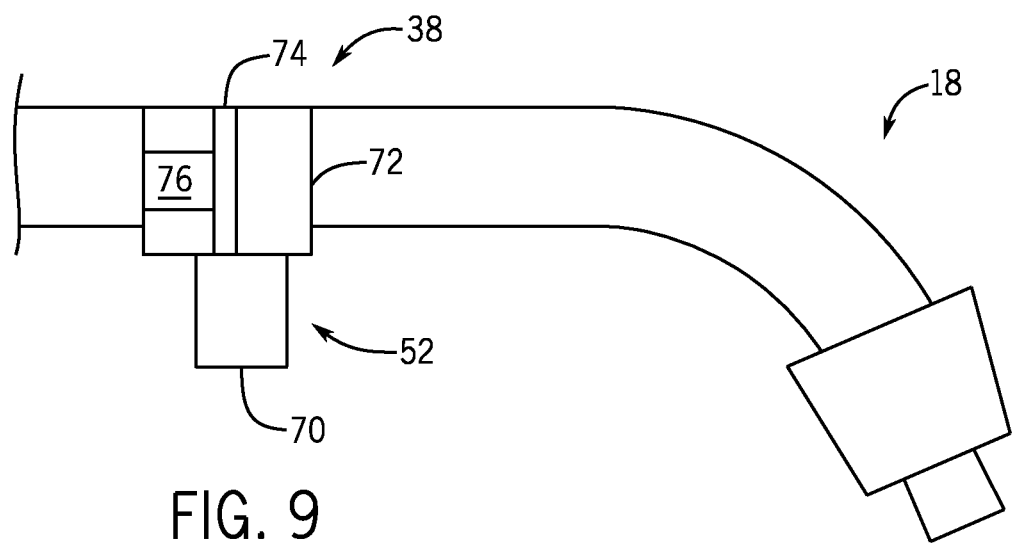

FIG. 9 is a schematic diagram of an embodiment of the energy harvesting system 38 disposed on the welding torch 18. In the illustrated embodiment, the energy harvesting device 52 includes a weight 70 offset from a stationary body 72. The weight 70 is configured to rotate about the stationary body 72 on a track 74 (e.g., disposed about the stationary body 72) due to the manipulation of the welding torch 18 by the operator. As a result, the rotational energy of the weight 70 is transferred to a generator 76. Moreover, in other embodiments, the rotation of the weight 70 may wind a spring disposed within the stationary body 72. Accordingly, the spring may be configured to store the energy of the weight 70 and transfer the stored energy to the generator 76 or other device configured to utilize the stored energy at a later time (e.g., when the device is coupled to a welding-related device capable of utilizing the stored energy). Accordingly, the normal operation of the welding torch 18 by the operator may be utilized to generate electrical energy to power associated welding-related devices.

Furthermore, in certain embodiments, the weight 70 may be positioned on the welding helmet 34. For example, the weight 70 may be positioned on a hinge coupling a visor to the welding helmet 34. As the visor is moved between a usage position (e.g., down) and a non-usage position (e.g., up) the weight 70 may rotate about the generator 76, thereby rotating a shaft of the generator 76 and generating electrical energy.

Figure 10:
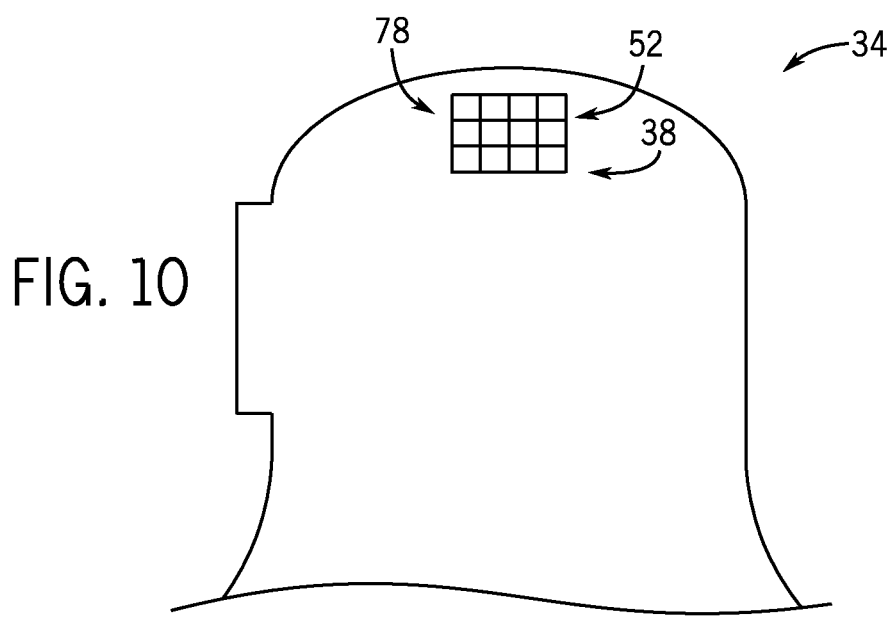

FIG. 10 is a schematic diagram of an embodiment of the energy harvesting system 38 disposed on the welding helmet 34. In the illustrated embodiment, the energy harvesting device 52 includes photovoltaic cells configured to convert light to electrical energy. For example, an array 78 (e.g., a solar array 78) of photovoltaic cells may be placed on the welding helmet 34 to capture and convert light (e.g., the sun, indoor lighting, light from the weld arc, light from a plasma cutter arc, light from a gauging arc, etc.) into electrical energy to power welding-related devices. For instance, as described above, the energy harvesting system 38 may include processing and conditioning circuitry to convert the light energy to electrical energy. Moreover, the energy harvesting system 38 may include the energy storage device 42 coupled to the energy harvesting device 52 to store the converted energy for use by a welding-related device. While the illustrated embodiment includes the array 78 on a side of the welding helmet 34, in other embodiments the array 78 may be placed on the front, the back, the top, or any suitable surface of the welding helmet 34 exposed to light. Additionally, in certain embodiments, the array 78 may be placed on the power supply 12, the wire feeder 14, the welding torch 18, or any other component of the welding system 10.

Figure 11:
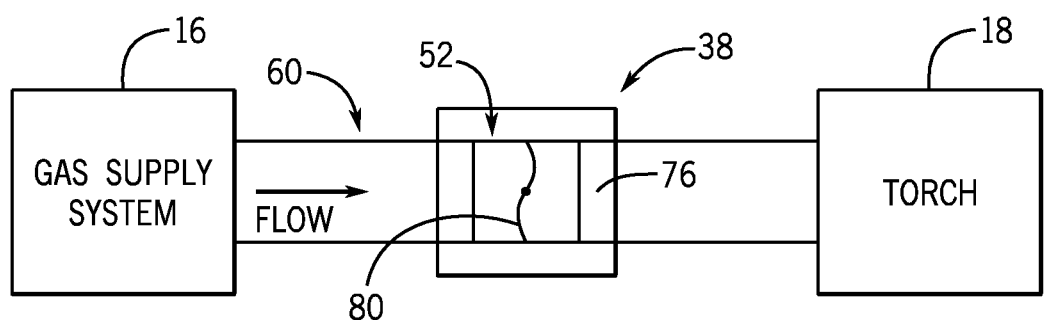

FIG. 11 is a schematic diagram of an embodiment of the energy harvesting system 38 disposed in the gas flow line 60 between the gas supply system 16 and the welding torch 18. In the illustrated embodiment, the energy harvesting device 52 includes a turbine 80 positioned in the gas flow line 60. As the gas flows through the gas flow line 60 toward the welding torch 18, energy is transferred to the turbine 80, inducing the turbine 80 to rotate within the gas flow line 60. The rotational energy of the turbine 80 may be transferred to the generator 76 to charge the energy storage device 42 for use with a welding-related device. While the illustrated embodiment includes the turbine 80 in the gas flow line 60 between the gas supply system 16 and the welding torch 18, in other embodiments, the turbine 80 may be disposed in a flow line between a supply of instrument air and an air powered tool. Moreover, the turbine 80 may be positioned in either the low or high pressure portions of the gas supply streams.

As described in detail above, the energy harvesting system 38 includes the energy harvesting device 52 to generate electrical energy to provide operational energy for welding accessories 36 and/or subsystems from ongoing welding processes. For example, the energy harvesting device 52 may be a piezoelectric device coupled to the peening hammer 64. As vibrational energy travels along the hammer 64, the piezoelectric device absorbs the kinetic energy and converts it to electrical energy. Furthermore, the processing controller 51 and conditioning circuitry 53 in the energy harvesting system 38 may convert the energy from the piezoelectric device for use in supply operational power to the welding accessories 36 (or other welding-related devices) or for storage in the energy storage device 42. As a result, the welding accessories 36 (or other welding-related devices) may receive operational energy without running additional cables to the welding accessories 36 (or other welding-related devices) or via direct electrical coupling with the weld cable 20. Additionally, the harvested electrical energy may be stored for later use. In certain embodiments, the energy harvesting system 38 is a stand-alone unit that may be mounted to components of the welding system 10 (e.g., the welding power supply unit 10, the wire feeder 14, the welding torch 18, etc.). However, in other embodiments, the energy harvesting system 38 may be integrated into the welding accessories 36 (or other welding-related devices) to provide on-board power and/or charging of the welding accessories 36. For example, a voltage sensor mounted on the welding torch 18 may include the energy harvesting system 38 to power the sensor during welding operations and/or to charge an integrated battery.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A welding system, comprising:
an energy harvester configured to draw electrical energy from a welding process without direct electrical contact with a source of the electrical energy, wherein the energy harvester is disposed on a welding torch and comprises a weight configured to rotate about a stationary body due to manipulation of the welding torch; and
a welding-related device configured to receive and use the electrical energy, wherein the welding-related device comprises a sensor disposed on a welding torch configured to perform the welding process, the sensor configured to measure conditions of the welding process.

2. The welding system of claim 1, wherein the welding-related device further comprises an energy storage and processing circuitry, the energy harvester configured to direct the electrical energy to the energy storage or to the welding-related device based on direction received from the processing circuitry.

3. The welding system of claim 2, wherein the energy storage is configured to provide operational energy to the welding-related device.

4. The welding system of claim 1, wherein the energy harvester is integrated with the welding-related device.

5. The welding system of claim 1, wherein the energy harvester is configured to supply operational energy to a wireless communication device of the welding-related device.

6. A welding system, comprising:
a welding power supply configured to supply a weld current for use in a welding operation;
a welding-related device configured to perform at least part of the welding operation, wherein the welding power supply monitors and controls the welding-related device, wherein the welding-related device comprises a sensor configured to measure conditions of the welding operation; and
an energy harvester configured to draw electrical energy from the welding operation without direct electrical contact with a source of the electrical energy, and to at least partially power the welding-related device, wherein the energy harvester is disposed on a welding torch and comprises a weight configured to rotate about a stationary body due to manipulation of the welding torch.

7. The welding system of claim 6, wherein the sensor is coupled to the welding torch.

8. The welding system of claim 6, wherein the energy harvester comprises wireless circuitry configured to send and receive signals to communicate with the welding power supply.

9. The welding system of claim 6, wherein the welding-related device comprises an energy storage configured to receive and store electrical energy from the energy harvester.

10. The welding system of claim 6, wherein the stationary body is coupled to the welding torch.

11. The welding system of claim 10, wherein the weight is configured to rotate about the stationary body on a track disposed about the stationary body.

* * * * *